(12) United States Patent
Ren et al.

(10) Patent No.: US 11,251,329 B2
(45) Date of Patent: Feb. 15, 2022

(54) METHOD OF TRANSFERRING A PLURALITY OF MICRO LIGHT EMITTING DIODES TO TARGET SUBSTRATE, ARRAY SUBSTRATE, DISPLAY APPARATUS

(71) Applicants: BEIJING BOE DISPLAY TECHNOLOGY CO., LTD., Beijing (CN); BOE Technology Group Co., Ltd., Beijing (CN)

(72) Inventors: Jinyu Ren, Beijing (CN); Bohua Chu, Beijing (CN)

(73) Assignees: BEIJING BOE DISPLAY TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 53 days.

(21) Appl. No.: 16/755,642

(22) PCT Filed: Apr. 22, 2019

(86) PCT No.: PCT/CN2019/083720
§ 371 (c)(1),
(2) Date: Apr. 13, 2020

(87) PCT Pub. No.: WO2020/215185
PCT Pub. Date: Oct. 29, 2020

(65) Prior Publication Data
US 2021/0226081 A1    Jul. 22, 2021

(51) Int. Cl.
*H01L 33/00*     (2010.01)
*H01L 25/075*   (2006.01)
*H01L 33/48*     (2010.01)

(52) U.S. Cl.
CPC ........ *H01L 33/005* (2013.01); *H01L 25/0753* (2013.01); *H01L 33/483* (2013.01)

(58) Field of Classification Search
CPC .. H01L 33/005; H01L 25/0753; H01L 33/483
See application file for complete search history.

(56) References Cited

U.S. PATENT DOCUMENTS

| | | | |
|---|---|---|---|
| 2003/0080402 A1 | 5/2003 | Corisis | |
| 2018/0197767 A1* | 7/2018 | Yue | H05K 13/0404 |

(Continued)

FOREIGN PATENT DOCUMENTS

| | | | | |
|---|---|---|---|---|
| CN | 106601661 A | * | 4/2017 | B25J 15/0052 |
| CN | 108010994 A | | 5/2018 | |

(Continued)

OTHER PUBLICATIONS

International Search Report & Written Opinion dated Feb. 5, 2020, regarding PCT/CN2019/083720.

*Primary Examiner* — Eliseo Ramos Feliciano
*Assistant Examiner* — Mikka Liu
(74) *Attorney, Agent, or Firm* — Intellectual Valley Law, P.C.

(57) ABSTRACT

A method of transferring a plurality of mero light emitting diodes (micro LEDs) to a target substrate s provided. The method includes providing a plurality of transfer strips, a respective one of the plurality of transfer strips including a plurality of holding cells sequentially arranged along a first direction; transferring a plurality of micro LEDs onto the plurality of holding cells of the plurality of transfer strips; and aligning the plurality of transfer strips having the plurality of micro LEDs transferred thereon with respect to each other, to form an array of micro LEDs in which micro LEDs from different transfer strips of the plurality of transfer strips we aligned along a second direction and micro LEDs from a same transfer strip of the plurality of transfer strips are aligned along the first direction, the second direction being different from the first direction.

11 Claims, 10 Drawing Sheets

(56) References Cited

U.S. PATENT DOCUMENTS

2018/0309019 A1   10/2018  Liao
2019/0088526 A1    3/2019  Bower et al.

FOREIGN PATENT DOCUMENTS

| CN | 108735872 A | | 11/2018 |
| CN | 109585342 A | * | 4/2019 |
| CN | 109585342 A | | 4/2019 |

* cited by examiner

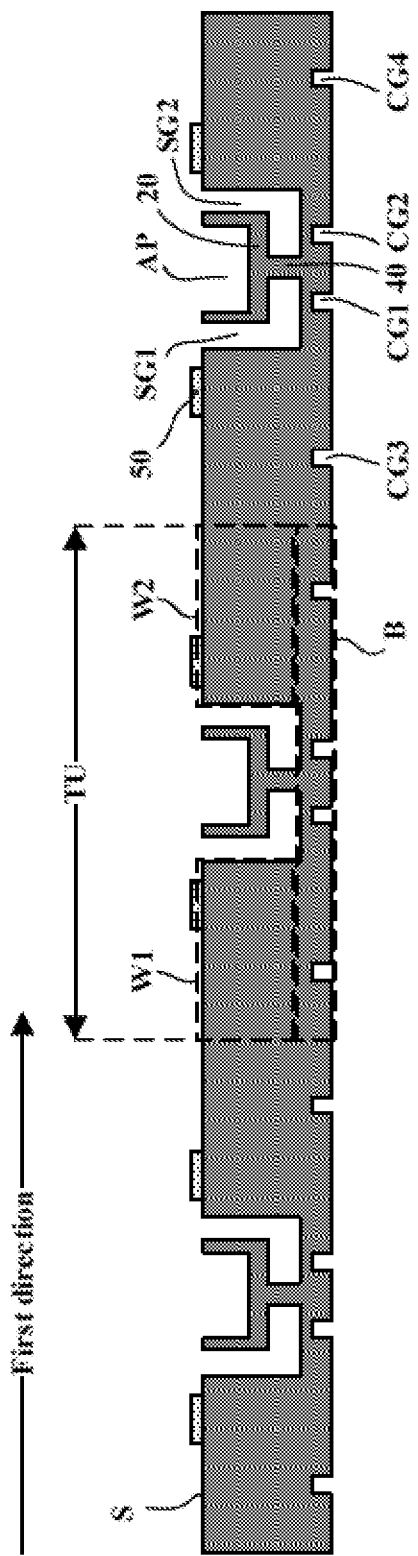
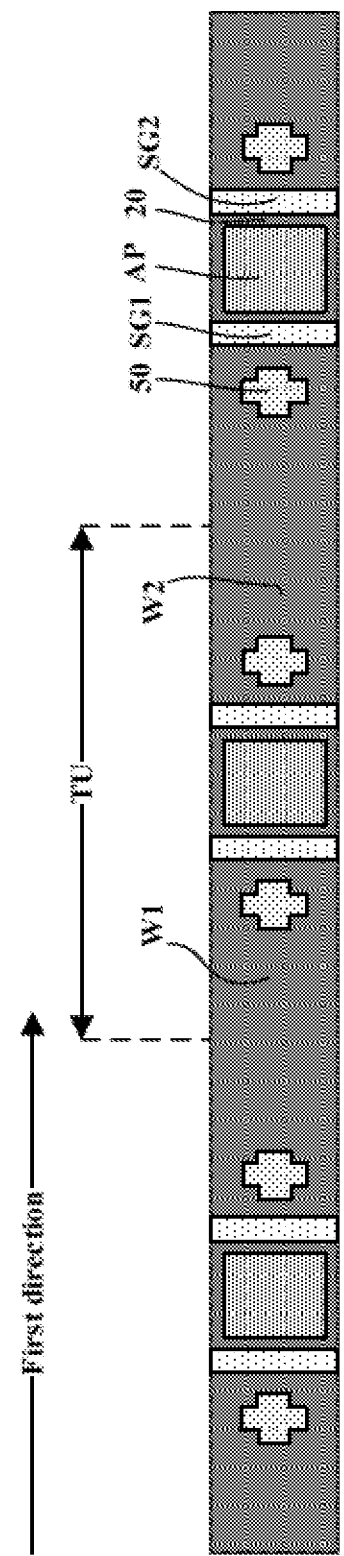
FIG. 1A
FIG. 1B

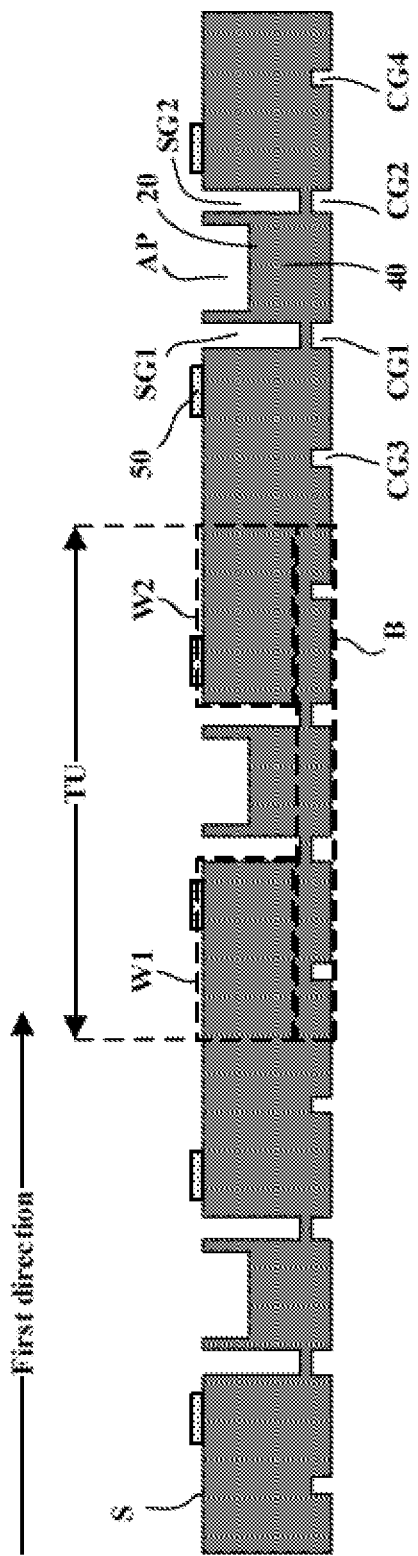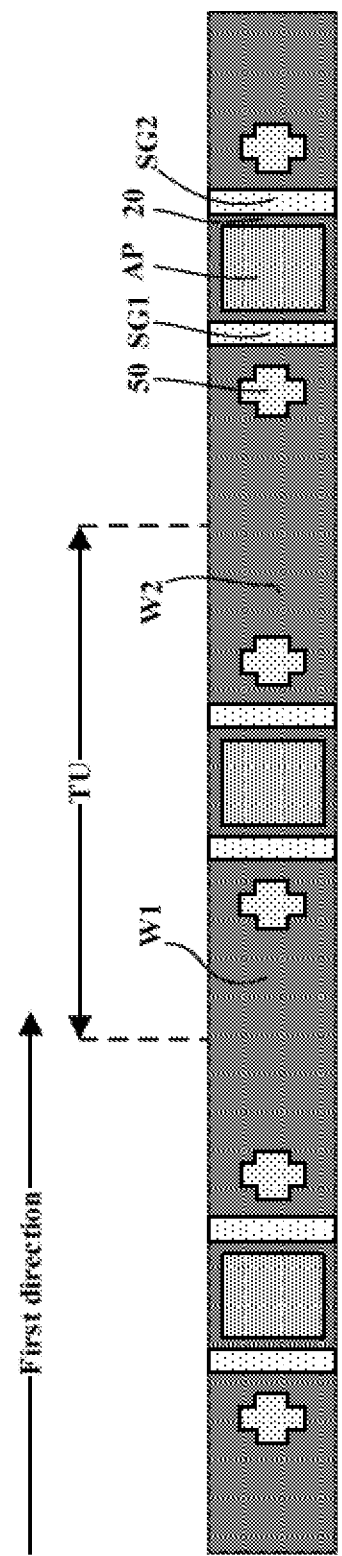

METHOD OF TRANSFERRING A PLURALITY OF MICRO LIGHT EMITTING DIODES TO TARGET SUBSTRATE, ARRAY SUBSTRATE, DISPLAY APPARATUS

CROSS-REFERENCE TO RELATED APPLICATION

This application is a national stage application under 35 U.S.C. § 371 of International Application No. PCT/CN2019/083720, filed Apr. 22, 2019, the contents of which are incorporated by reference in the entirety.

TECHNICAL FIELD

The present invention relates to display technology, more particularly, to a method of transferring a plurality of micro light emitting diodes to a target substrate, an array substrate, a display apparatus, and a transfer strip for transferring a plurality of micro light emitting diodes to a target substrate.

BACKGROUND

In recent years, miniaturized electro-optics devices are proposed and developed, including micro light emitting diode (micro LED). The micro LED-based display panels have the advantages of high brightness high contrast ratio, fast response, and low power consumption. The micro LED-based display technology has found a wide range of applications in the display field, including smartphones and smart watches.

SUMMARY

In one aspect, the present invention provides a method of transferring a plurality of micro light emitting diodes (micro LEDs) to a target substrate, comprising providing a plurality of transfer strips, a respective one of the plurality of transfer strips comprising a plurality of holding cells sequentially arranged along a first direction, a respective one of the plurality of holding cells configured to receive a respective one of the plurality of micro LEDs, the respective one of the plurality of holding cells being severable from the respective one of the plurality of transfer strips; transferring the plurality of micro LEDs onto the plurality of holding cells of the plurality of transfer strips; and aligning the plurality of transfer strips having the plurality of micro LEDs transferred thereon with respect to each other, to form an array of micro LED in which micro LEDs from different transfer strips of the plurality of transfer strips are aligned along a second direction and micro LEDs from a same transfer ship of the plurality of transfer strips we aligned along the first direction, the second direction being different from the first direction.

Optionally subsequent to aligning the plurality of transfer sips having the plurality of micro LEDs transferred thereon, the method further comprises adhering neighboring transfer sips of the plurality of transfer sips having the plurality of micro LED transferred thereon together.

Optionally, subsequent to aligning the plurality of transfer strips having the plurality of micro LEDs transferred thereon, the method further comprises severing the plurality of holding cells from the respective one of the plurality of trans ships, to forma plurality of micro LED strips, a respective om of the plurality of micro LED sips comprising micro LEDs from different transfer strips of the plurality of transfer strips sequentially arranged along the second direction.

Optionally, severing the plurality of holding cells comprises cutting a base of the plurality of transfer ships along a first cutting groove and a second cutting groove along the second direction, to sever a row of holding cells along the second direction thereby forming the respective one of the plurality of micro LED strips.

Optionally, subsequent to severing the plurality of holding cells from the respective one of the plurality of transfer strips, the method further comprises adhering neighboring micro LED ships of the plurality of micro LED strips together, to from a micro LED substrate in which micro LEDs from different transfer ships of the plurality of transfer strips we aligned along the second direction and micro LEDs from the same transfer strip of the plurality of transfer strips are aligned along the first direction.

Optionally, the method further comprises transferring the plurality of micro LEDs in the micro LED substrate onto the target substrate.

Optionally, subsequent to transferring the plurality of micro LEDs onto the plurality of holding cells of the plurality of transfer sips and prior to aligning the plurality of transfer strips having the plurality of micro LEDs transferred thereon with respect to each other, the method further comprises testing the plurality of micro LEDs to detect a defective micro LED.

Optionally, the method further comprises removing the defective micro ED from the respective one of the plurality of transfer strips; and reassembling the respective one of the plurality of transfer strips having the defective micro LED removed into a continuous transfer strip.

Optionally, removing the defective micro LED from the respective one of the plurality of transfer strips comprises cutting the respective one of the plurality of transfer skips along a respective one of a plurality of third cutting grooves and a respective one of a plurality of fourth cutting grooves.

Optionally, aligning the plurality of transfer strips is based on a plurality of alignment marks on the plurality of transfer strips; and wherein alignment marks from different transfer strips of the plurality of transfer strips ae aligned along the second direction.

In another aspect, the present invention provides array substrate, comprising the plurality of micro LEDs transferred by the method described herein.

In another aspect, the present invention provides a display apparatus, composing the array substrate described herein.

In another aspect, the present invention provides a transfer strip for transferring a plurality of micro light emitting diodes (micro LEDs) to a target substrate, comprising a plurality of holding cells sequentially arranged along a first direction, a respective one of the plurality of holding cells configured to receive a respective one of the plurality of micro LEDs, the respective one of the plurality of holding cells being severable from the transfer strip; and a plurality of alignment marks on a surface of the transfer strip.

Optionally, the transfer sip further comprises a base on which the respective one of the plurality of holding cells is disposed; wherein the respective one of the plurality of holding cells is spaced apart from a first wall on a first side by a first separation groove and spaced apart from a second wall on a second side by a second separation groove.

Optionally, the transfer strip further comprises a support connecting the respective one of the plurality of holding cells to the base.

Optionally, the plurality of alignment marks comprise two alignment marks respectively on the first wall and the second wall.

Optionally, the transfer strip comprises a plurality of first cutting grooves and a plurality of second cutting grooves for respectively severing the plurality of holding cells from the transfer skip; wherein a respective am of the plurality of first cutting grooves and a respective an of the plurality of second cutting grooves respectively partially extend into the base.

Optionally, a respective am of the plurality of first cutting grooves and a respective one of the plurality of second cutting grooves ae in regions outside regions corresponding to the first wall and the second wall.

Optionally, the transfer strip further comprises a plurality of third cutting grooves and a plurality of fourth cutting grooves; orthographic projections of the first wall and the second wall on the base cover a respective ae of the plurality of third cutting grooves and a respective one of the plurality of fourth cutting grooves.

Optionally, an entirety of the transfer strip is substantially transparent.

BRIEF DESCRIPTION OF THE FIGURES

The following drawings are merely examples for illustrative purposes according to various disclosed embodiments and are not intended to limit the scope of the present invention.

FIG. 1A is a cross-sectional view of a transfer strip in some embodiments according to the present disclosure.

FIG. 1B is a plan view of a transfer strip in some embodiments according to the present disclosure.

FIG. 2A is a cross-sectional view of a transfer strip in some embodiments according to the present disclosure.

FIG. 2B is a plan view of a transfer strip in some embodiments according to the present disclosure.

DETAILED DESCRIPTION

Figure 3:
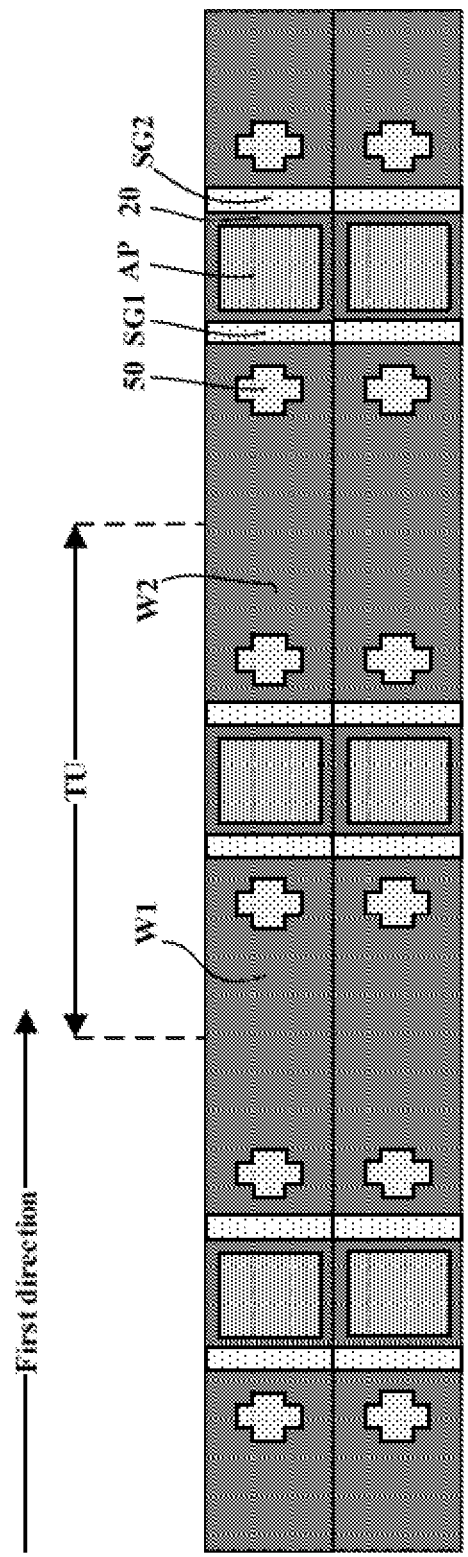
FIG. 3 is a plan view of a transfer strip in some embodiment according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a micro light emitting diode (micro LED) display panel each of the micro LED has to be transferred from a growth substrate to a target substrate. Considering the display panel includes thousands to millions of micro LEDs, the transfer process is extremely complicated and time-consuming. Also, it is difficult to detect and repair defective micro LEDs transferred during the conventional transferring process.

Accordingly, the present disclosure provides, inter alia, a method of transferring a plurality of micro light emitting diodes to a target substrate, an array substrate, a display apparatus, and a transfer strip for transferring a plurality of micro light emitting diodes to a target substrate that substantially obviate one r more of the problems due to limitations and disadvantages of the related art. In ene aspect the present disclosure provides a transfer strip for transferring a plurality of micro light emitting diodes (micro LEDs) to a target substrate. In some embodiments, the transfer strip includes a plurality of holding cells sequentially arranged along a first direction, a respective one of the plurality of holding cells configured to receive a respective one of the plurality of micro LEDs, the respective one of the plurality of holding cells being severable from the transfer strip. Optionally, the transfer strip further includes a plurality of alignment marks on a surface of the transfer strip.

FIG. 1A is a cross-sectional view of a transfer strip in some embodiments according to the present disclosure. FIG. 1B is a plan view of a transfer strip in some embodiments, according to the present disclosure. Referring to FIG. 1A and FIG. 1B, in some embodiments, the transfer strip includes a plurality of holding cells 20 sequentially arranged along a first direction. A respective one of the plurality of holding cells 20 is configured to receive a respective one of the plurality of micro LEDs. The respective one of the plurality of holding cells 20 is severable from the transfer strip. Optionally, the transfer strip further includes a plurality of alignment marks 50 on a surface S of the transfer strip.

In some embodiment, the transfer sip includes a plurality of transfer units TU sequentially connected together. A respective one of the plurality of holding cells 20 in a respective one of the plurality of transfer units TU. In some embodiments, the respective one of the plurality of transfer units TU includes a base B on which the respective one of the plurality of holding cells 20 is disposed. As shown in FIG. 1A and FIG. 1B, the respective one of the plurality of transfer units TU further includes a first wall W and a second wall W2 facing each other and spaced apart form each other. The respective one of the plurality of holding cells 20 is spaced apart from the first wall W1 on a first side by a first separation groove SG1 and spaced apart from the second wall W2 on a second side by a second separation groove SG2.

The respective one of the plurality of holding cells 20 defines an aperture AP configured to receive the respective one of the plurality of micro LEDs. For ample, the aperture AP has a size appropriate for securely receiving the respective one of the plurality of micro LEDs. The aperture AP may have various appropriate shapes and dimensions, depending on the shape and dimension of the respective one of the plurality of micro LEDs to be received in the aperture AP. Optionally, the aperture AP has a depth sufficient for holding the respective one of the plurality of micro LEDs. In one example, the depth of the aperture AP is substantially the same as a depth of the respective one of the plurality of micro LEDs to be received in the aperture AP. Optionally, a lateral wall of the respective one of the plurality of holding cells 20 has a height substantially the same as the depth of the respective one of the plurality of micro LEDs. As used herein, the term "substantially the same" refers to a difference between two values not exceeding 10% of a base value (e.g., one of the two values), e.g., not exceeding 8%, not exceeding 6%, not exceeding 4%, not exceeding 2%, M not exceeding 1%, not exceeding 0.5%, not exceeding 0.1%, not exceeding 0.05%, and not exceeding 0.01%, of the base value. In another example, the depth of the aperture AP is about 11 to about ½ of the depth of the respective one of the plurality of micro LEDs to be received in the aperture AP. Optionally, the lateral wall of the respective one of the plurality of holding cells 20 has a height about 13 to about ½ of the depth of the respective one of the plurality of micro LEDs.

In some embodiments, a respective one of the plurality of transfer units TU includes one or more of the plurality of alignment marks 50 (e.g., at least one alignment mark, at least two alignment marks, one at each end of the respective one of the plurality of transfer units TU, a single one alignment mark per ne of the plurality of transfer units TU, and so on). Optionally, the respective one of the plurality of transfer units TU includes a first align mark on the first wall W and a second alignment mark on the second wall W2. Optionally, the first alignment mark and the second alignment mark are aligned with respect to a center of the aperture AP. Optionally, the first alignment mark and the second alignment mark are aligned with respect to a center of the respective one of the plurality of holding cells 20. Optionally, the plurality of alignment marks 50 are aligned with respect to centers of the plurality of holding cells 20.

In some embodiments, the transfer strip further includes a support 40 connecting the respective one of the plurality of holding cells 20 to the base B. Optionally, the support 40 is disposed at the center of the respective one of the plurality of holding cells 20.

In some embodiments, the transfer strip includes a plurality of first cutting grooves CG1 and a plurality of second cutting grooves CG2 for respectively severing the plurality of holding cells 20 from the transfer strip. A respective one of the plurality of first cutting grooves CG and a respective one of the plurality of second cutting grooves CG2 respectively partially extend into the base B. In one example, when severing the respective one of the plurality of holding cells 20 from the transfer strip, the base B is cut through along the respective one of the plurality of first cutting grooves CG1 and along the respective one of the plurality of second cutting grooves CG2, thereby connecting the respective one of the plurality of first cutting grooves CG1 with the first separation groove SG1, and connecting the respective one of the plurality of second cutting grooves CG2 with the second separation groove SG2. As a result, the respective one of the plurality of holding cells 20 is severed from the transfer strip. Optionally, orographic projections of the first wall W1 and the second wall W2 on the base B do not cover the respective one of the plurality of first cutting grooves CG1 and the respective one of the plurality of second cutting grooves CG2. Optionally, an orthographic projection of the respective one of the plurality of holding cells 20 on the base B at least partially covers the respective one of the plurality of first cutting grooves CG1 and the respective one of the plurality of second cutting grooves CG2. Optionally, the respective one of the plurality of first cutting grooves CG is in a region corresponding b the first separation groove SG1, and the respective one of the plurality of second cutting grooves CG2 is in region corresponding to the second separation groove SG2.

In some embodiments, the transfer strip includes a plurality of third cutting grooves CG3 and a plurality of fourth cutting grooves CG4 for respectively removing the plurality of holding cells 20 from the transfer strip. Optionally, orthographic projections of the first wall W1 and the second wall W2 on the base B cover the respective me of the plurality of third cutting grooves CG3 and the respective one of the plurality of fourth cutting grooves CG4. For example, an orthographic projection of the first wall W1 on the base B covers the respective one of the plurality of third cutting grooves CG3, and an orthographic projection of the second wall W2 on the base B covers de respective one of the plurality of fourth cutting grooves CG4.

Optionally, an entirety of the transfer strip is substantially transparent. As a result, a remaining portion of the transfer strip may be used as a protective layer for protecting the plurality of micro LEDs when they are transferred to a target substrate. As used herein, the term "substantially transparent" means at least 50% (e.g., at least 60%, at least 70%, at least 80%, at least 90%, and at least 95%) of an incident light in the visible wavelength range transmitted therethrough.

Optionally, the transfer strip includes a single row of the plurality of holding cells 20 along the first direction, as shown in FIG. A and FIG. B.

FIG. 2A is a cross-sectional view of a transfer strip in some embodiments according to the present disclosure. FIG. 2B is a plan view of a transfer strip in some embodiments according to the present disclosure. As shown in FIG. 2A and FIG. 2B, a lateral side of a respective one of plurality of holding cells 20 and a lateral side of a support 40 supporting the respective one of plurality of holding cells 20 are substantially co-planar. Optionally, a region corresponding to a respective one of the plurality of first cutting grooves CG1 is between orthographic projections of the support 40 and the first wall W1 on the base B. Optionally, a region corresponding to a respective one of the plurality of second cutting grooves CG2 is between orthographic projections of the support 40 and the second wall W2 on the base B. Optionally, the respective one of the plurality of first cutting grooves CG1 is aligned with a first separation groove SG1 corresponding to the respective one of the plurality of first cutting grooves CG1. Optionally, a gap width of the respective one of the plurality of first cutting grooves CG1 is substantially the same as a gap width of the first separation groove SG1 corresponding to the respective one of the plurality of first cutting grooves CG1. Optionally, the respective one of the plurality of second cutting grooves CG2 is aligned with a second separation groove SG2 corresponding to the respective one of the plurality of second cutting grooves CG2. Optionally, a gap width of the respective one of the plurality of second cutting grooves CG2 is substantially the same as a gap width of the second separation groove SG2 corresponding to the respective one of the plurality of second cutting grooves CG2.

FIG. 3 is a plan view of a transfer strip in some embodiments according to the present disclosure. Referring to FIG. 3, the transfer strip in some embodiments includes multiple rows (e.g., two rows) of the plurality of holding cells 20 along the first direction.

In another aspect, the present disclosure provides a method of transferring a plurality of micro light emitting diode (micro LEDs) to a target substrate. In some embodiments, the method includes providing a plurality of transfer strips, a respective one of the plurality of transfer strips including a plurality of holding cells sequentially arranged along a first direction, a respective one of the plurality of holding cells configured to receive a respective one of the plurality of micro LEDs, the respective one of the plurality of holding cells being severable from the respective one of the plurality of transfer strips; transferring the plurality of micro LEDs onto the plurality of holding cells of the plurality of transfer strips; and aligning the plurality of transfer strips having the plurality of micro LEDs transferred thereon with respect to each other, to form an array of micro LEDs in which micro LEDs from different transfer strips of the plurality of transfer strips re aligned along a second direction and micro LEDs from a same transfer strip of the plurality of transfer strips we aligned along the first direction, the second direction being different from the first direction.

Figure 4:
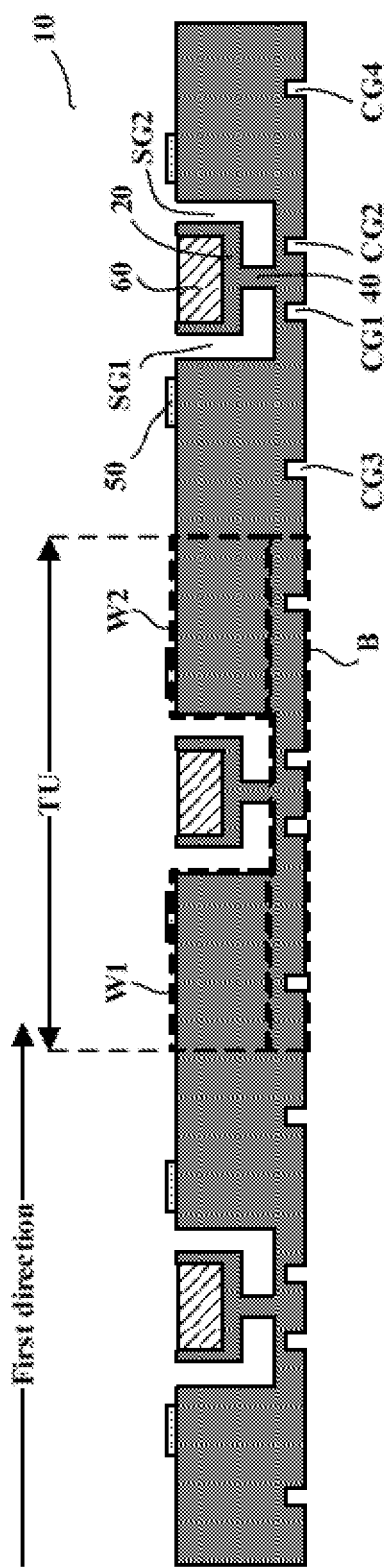
FIGS. 4 to 10 illustrate a method of transferring a plurality of micro light emitting diodes to a target substrate in some embodiments according to the present disclosure.
Figure 5:
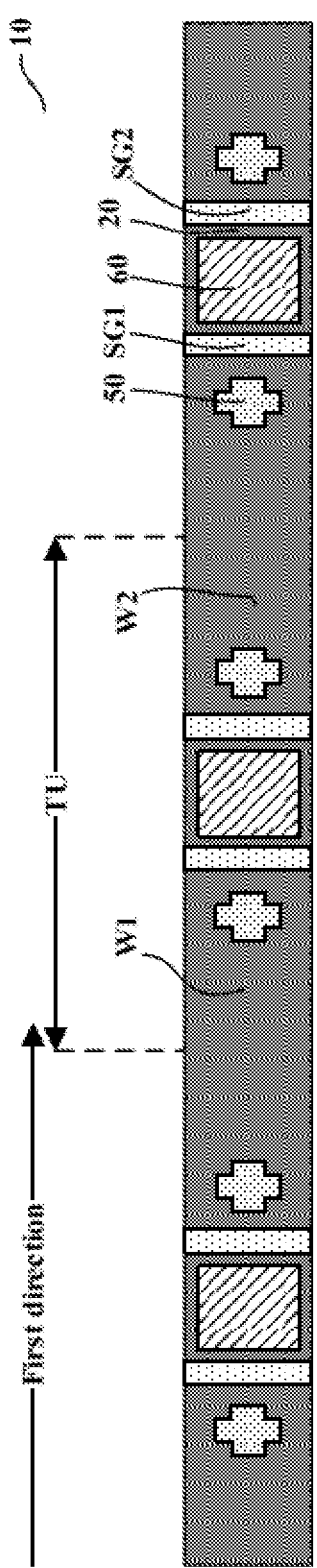

FIGS. 4 to 10 illustrate a method of transferring a plurality of micro light emitting diodes to a target substrate in some embodiments according to the present disclosure. FIG. 4 provides a cross-sectional view of a respective one of the plurality of transfer strips 10, and FIG. 5 provides a plan view of the respective one of the plurality of transfer strips 10. Referring to FIG. 4 and FIG. 5, a plurality of transfer strips 10 are provided for transferring a plurality of micro LEDs 60. As discussed above, a respective one of the plurality of transfer strips 10 includes a plurality of holding cells 20 sequentially arranged along a first direction. A respective one of the plurality of holding cells 20 is configured to receive a respective one of the plurality of micro LEDs 60. The respective ne of the plurality of holding cells 20 is severable from the transfer strip 10. Optionally, the transfer strip 10 further includes a plurality of alignment marks 50 on a surface S of the respective one of the plurality of transfer strips 10.

Figure 6:
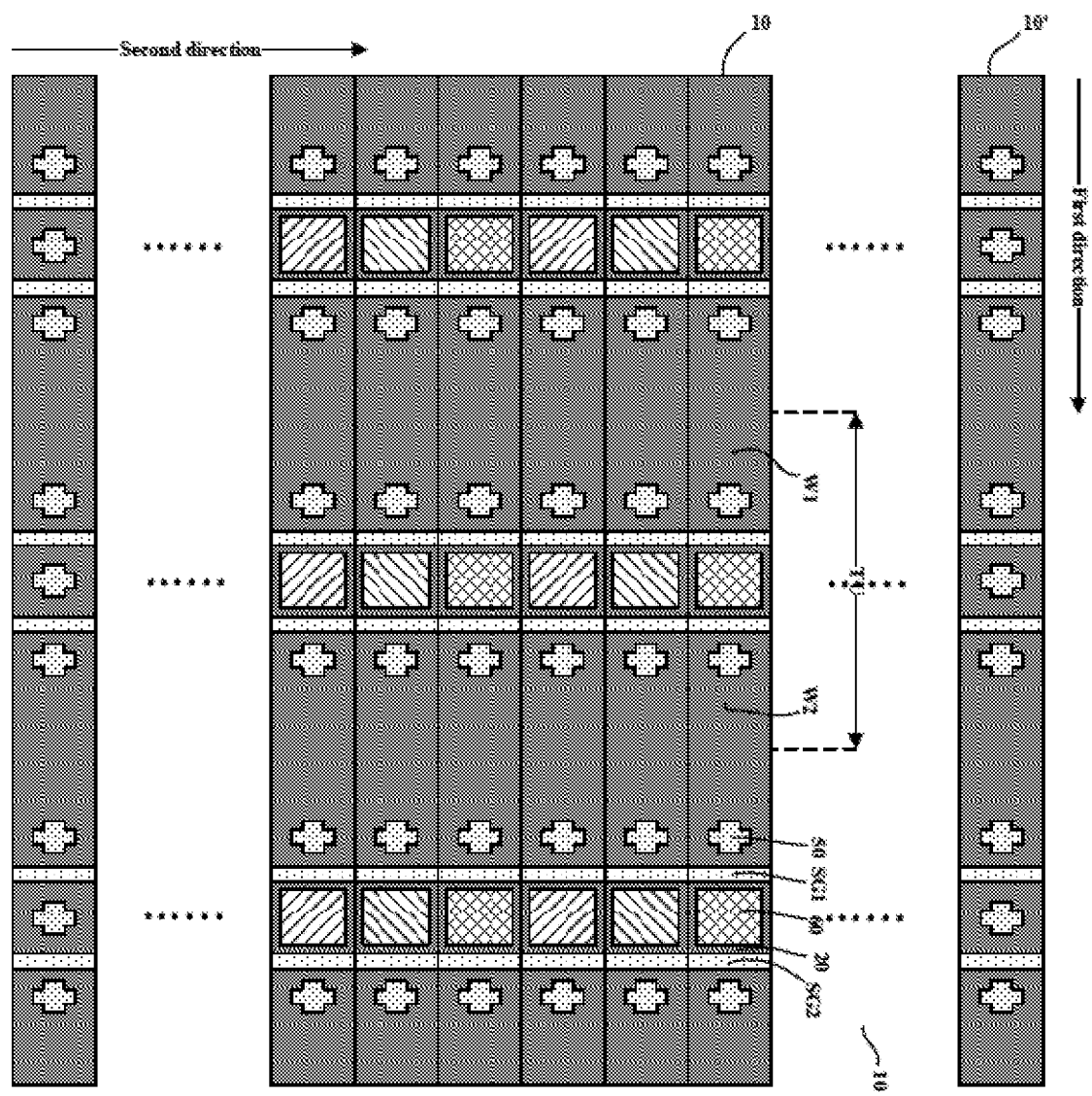

As shown in FIG. 4 and FIG. 5, a plurality of micro LEDs 60 we transferred onto the plurality of holding cells 20 of the plurality of transfer strips 10. Referring to FIG. 6, the method in some embodiments includes aligning the plurality of transfer strips 10 having the plurality of micro LEDs 60 transferred thereon with respect to each other. As a result of the alignment process, an array of micro LEDs is formed in which micro LEDs from different transfer strips of the plurality of transfer strips 10 are aligned along a second direction and micro LEDs from a same transfer strip of the plurality of transfer strips 10 we aligned along the first direction, the second direction being different from the first direction. Subsequent to aligning the plurality of transfer strips 10, the plurality of transfer strips 10 may be adhered together, e.g., neighboring transfer strips of the plurality of transfer strips 10 having the plurality of micro LEDs transferred thereon may be adhered together. In some embodiments, aligning the plurality of transfer strips 10 is based n a plurality of alignment marks 50 on the plurality of transfer strips 10. Optionally, alignment marks from different transfer strips of the plurality of transfer skips 10 are aligned along the second direction.

Optionally, and referring to FIG. 6, two dummy strips 10' that do not have micro LEDs may be used on two edges of the assembled array of micro LEDs. In one example, in lieu of a plurality of holding cells, the two dummy strips 10' nay include alignment marks 50 in the place of the plurality of holding cells. By including the two dummy strips 10' in the assembled array of micro LEDs, the alignment process may be performed with an enhanced accuracy and precision FIG. 6 illustrates an exemplary embodiment in which two dummy strips 10' are used. Optionally, a single dummy strip may suffice for alignment. Optionally, more than two dummy strips can be used for alignment.

Figure 7:
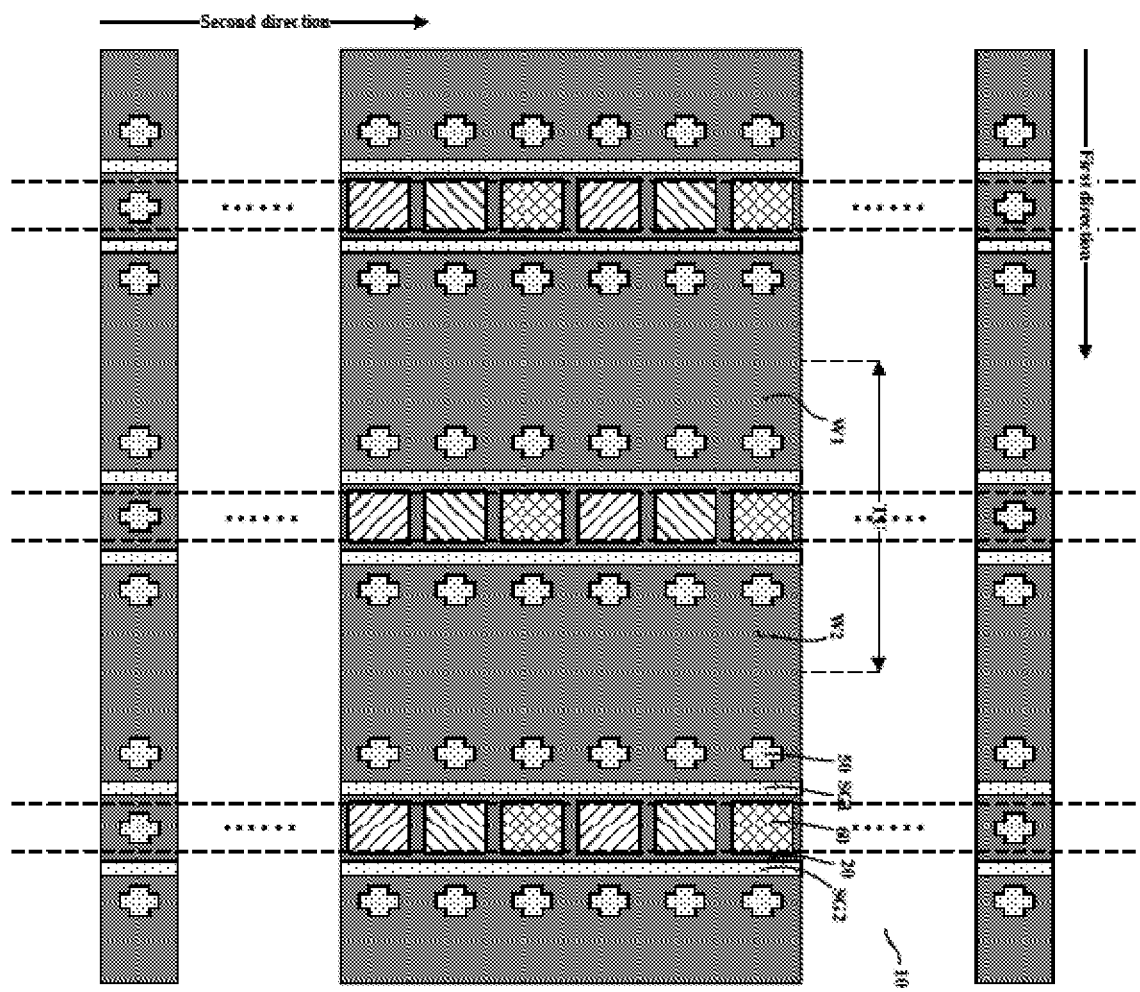

Referring to FIG. 7, subsequent to aligning the plurality of transfer strips 10 having the plurality of micro LEDs 60 transferred thereon, the method in some embodiments further includes severing the plurality of holding cells 20 from the respective ne of the plurality of transfer strips 10. For example, referring to FIG. 4, FIG. 5, and FIG. 7, severing the plurality of holding cells 20 from the respective one of the plurality of transfer strips 10 in some embodiments includes cutting the base B along the plurality of first cutting grooves CG1 and the plurality of second cutting grooves CG2, thereby severing a raw of holding cells along the second direction.

Figure 8:
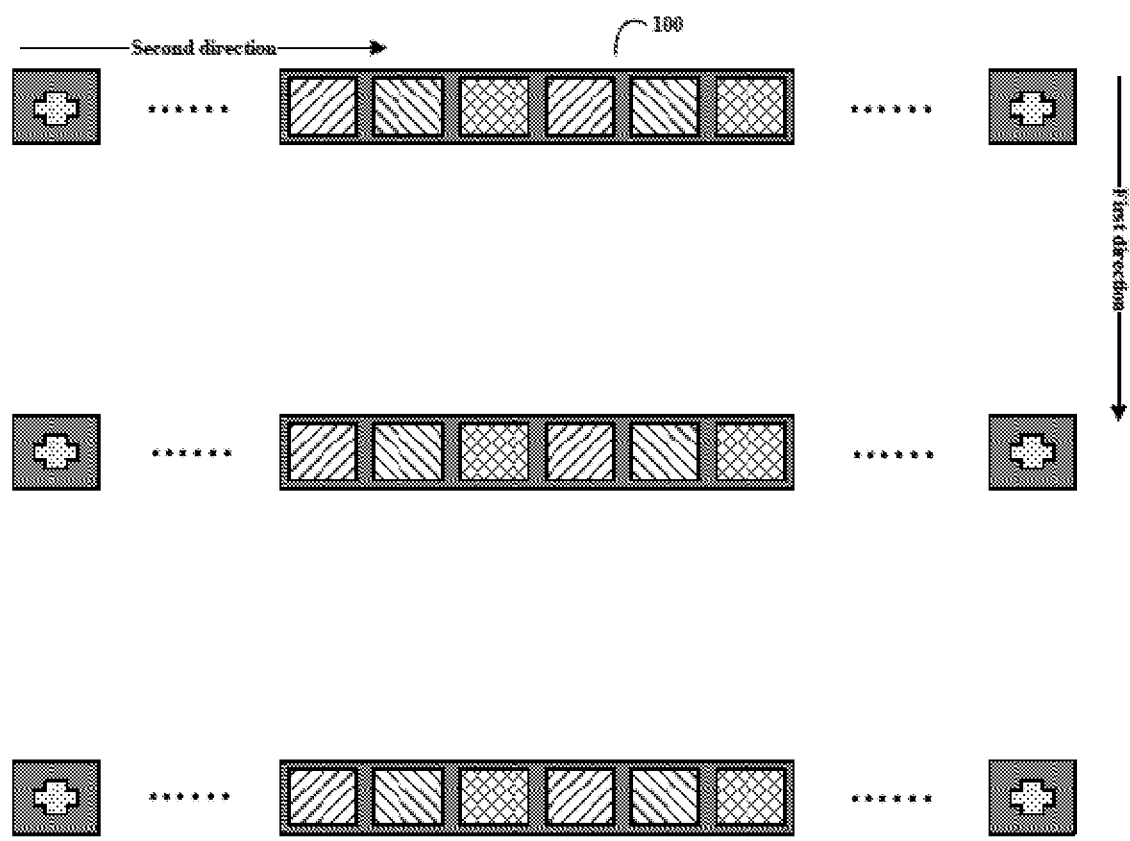

Referring to FIG. 8, as a result of the severing, a plurality of micro LED strips 100 are formed. A respective one of the plurality of micro LED strips 100 is formed to include micro LEDs from different transfer strips of the plurality of transfer strips 10 sequentially arranged along the second direction. For example, the first wall W1 and the second wall W2 of a respective one of the plurality of transfer units TU are removed as a result of the severing. The respective one of the plurality of holding cells 20 remains.

Figure 9:
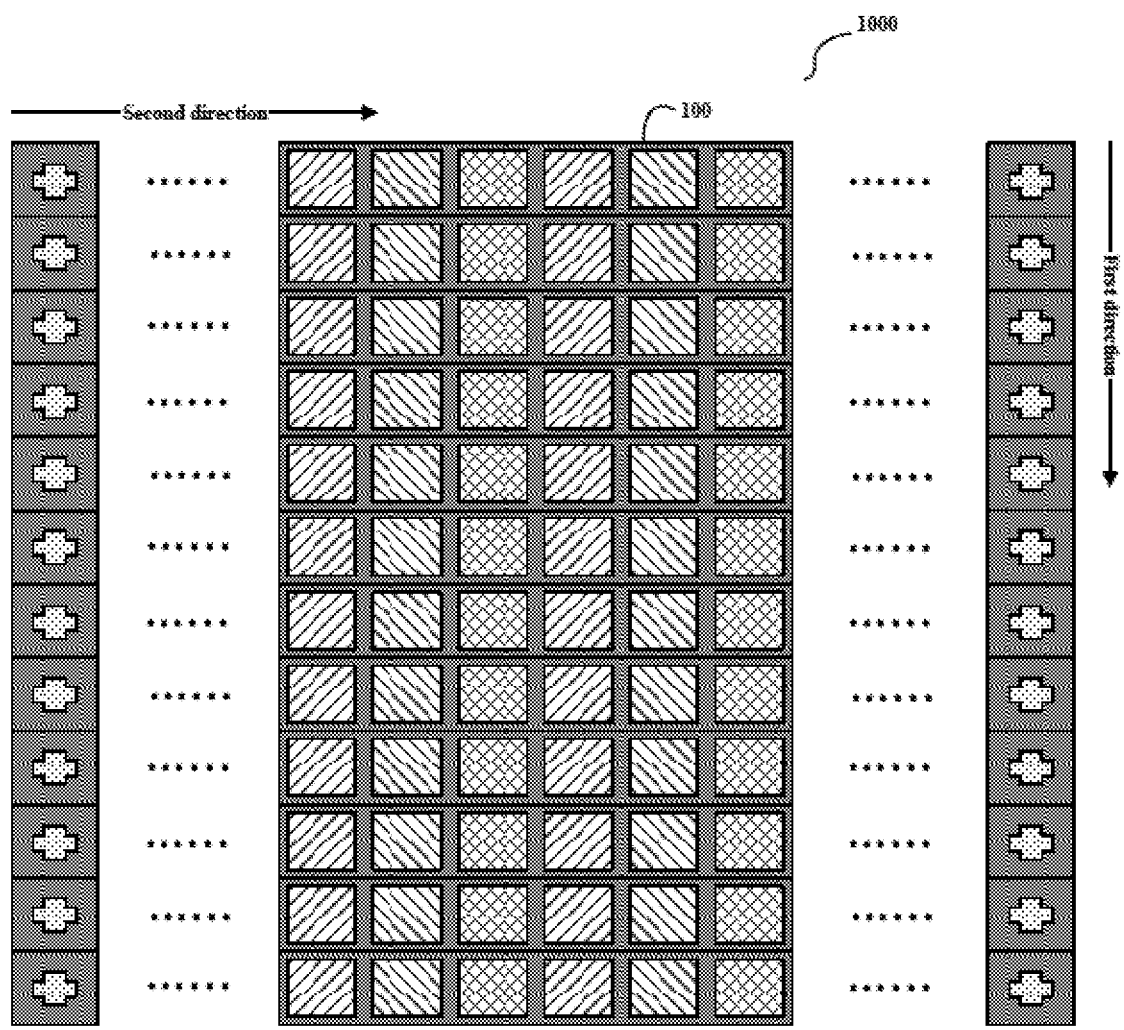

Referring to FIG. 9, subsequent to severing the plurality of holding cells from the respective one of the plurality of transfer strips, the method in some embodiments further includes adhering the plurality of micro LED strips 100 together to form a micro LED substrate 1000, e.g., neighboring micro LED strips of the plurality of macro LED strips 100 are adhered together to form a micro LED substrate 1000. In the process of adhering the plurality of micro LED strips 100, the alignment made from the two dummy strips remaining on the plurality of micro LED strips 100 may be used for pro-aligning the plurality of micro LED strips 100 prior to adhering the plurality of mero LED strips 100. In the micro LED substrate 1000, micro LEDs from different transfer strips of the plurality of transfer strips are aligned along the second direction and micro LEDs from the same transfer strip of the plurality of transfer strips are aligned along the first direction.

Figure 10:
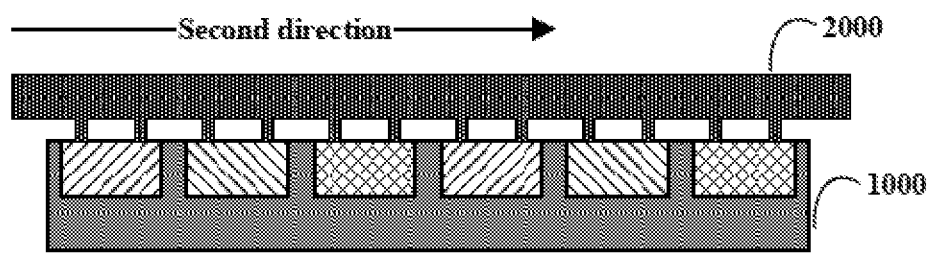

Referring to FIG. 10, in some embodiments, the method further includes transferring the plurality of micro LEDs in the micro LED substrate 1000 onto a target substrate 2000. Optionally, a remaining material (e.g., one or a combination of the base B and the support 40) of the plurality of transfer strips is partially or fully removed from the micro LED substrate 1000. Optionally, the remaining material of the plurality of transfer strips is kept on the micro LED substrate 1000, and functions as a protective layer for protecting micro LEDs. FIG. 10 shows an exemplary embodiment in which the base B at least partially remain, and functions as the protective layer. In one example, the substrate of FIG. 10 is fabricated using the transfer strip as shown in FIG. 1A and FIG. 1B as the starting material, and the support 40 is removed whereas the base B at least partially remains. In another example, the substrate of FIG. 10 is fabricated using the transfer strip as shown in FIG. 2A and FIG. 2B as the starting material, and the support 40 and the base B we substantially unremoved.

In some embodiments, subsequent to transferring the plurality of micro LEDs onto the plurality of holding cells of the plurality of transfer strip and prior to aligning the plurality of transfer strips having the plurality of micro LEDs transferred thereon with respect to each other, the method further includes testing the plurality of micro LEDs to detect a defective micro LED. When a defective micro LED is detected, the method in some embodiments further includes removing the defective micro LED from the respective one of the plurality of transfer strips.

Figure 11:
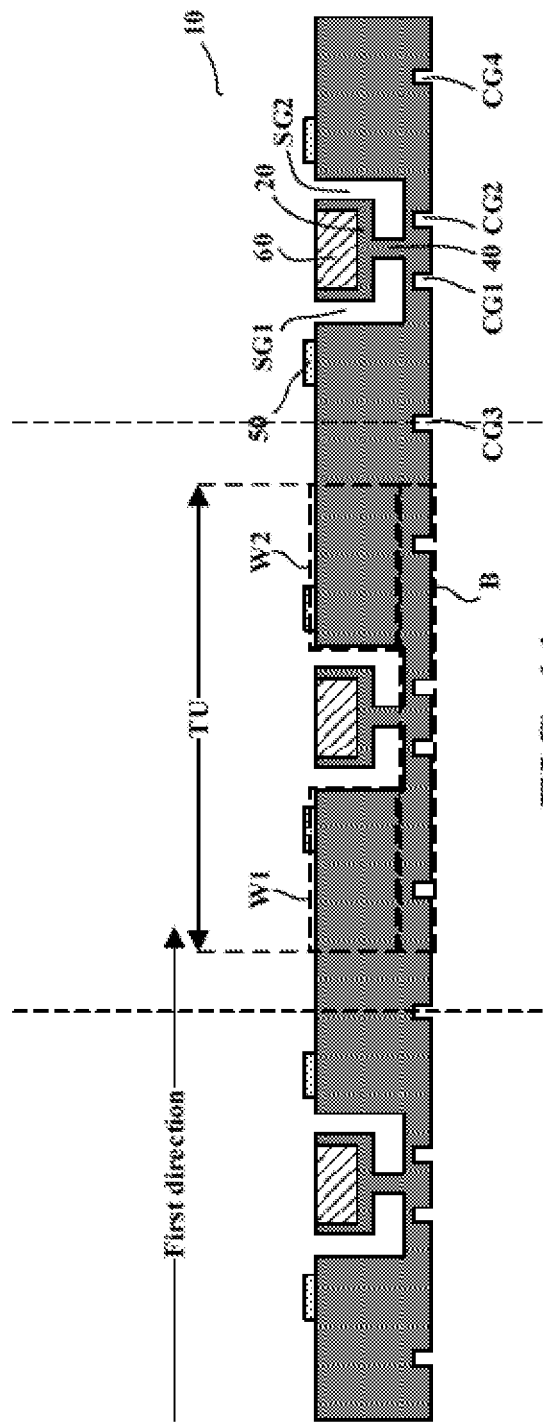
FIGS. 11 to 13 illustrate a method of repairing a defective micro LED from the respective one of the plurality of transfer sips in some embodiments according to the present disclosure.
Figure 12:
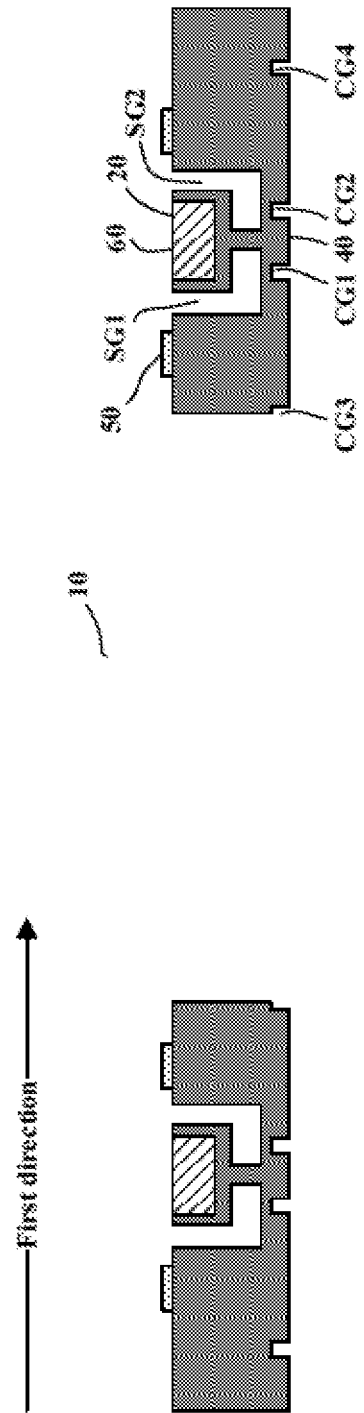
Figure 13:
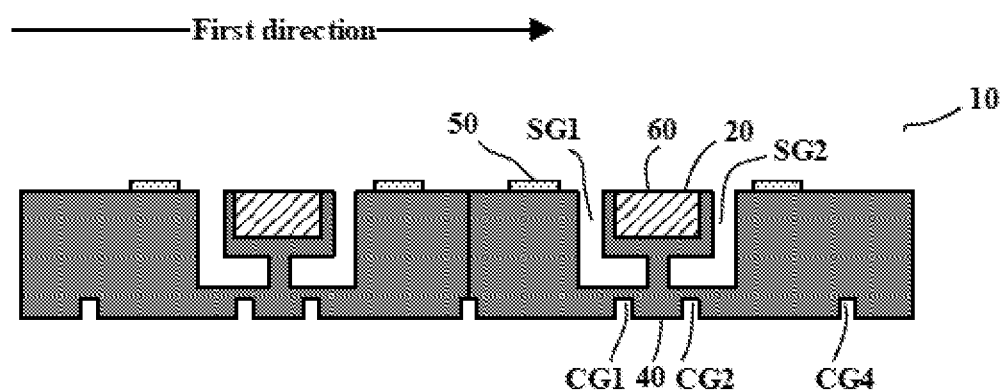

FIGS. 11 to 13 illustrate a method of repairing a defective macro LED from the respective one of the plurality of transfer strips in same embodiments according to the present disclosure. Referring to FIG. 11, the method in some embodiments includes cutting the respective one of the plurality of transfer strips 10 along a respective one of the plurality of third cutting grooves CG3 and a respective one of the plurality of fourth cutting grooves CG4, to removing a defective micro LED from the respective one of the plurality of transfer strips 10. FIG. 12 shows the respective one of the plurality of transfer strips 10 with the defective micro LED being removed. Referring to FIG. 13, the method in some embodiments further includes reassembling (e.g., by adhesive or heat) the respective one of the plurality of transfer strips 10 having the defective micro LED removed into a continuous transfer strip. As shown in FIGS. 11 to 13, the repairing process removes a respective one of the plurality of transfer units TU containing the defective micro LED from the respective one of the plurality of transfer strips 10. The present method is capable of quickly repairing defective micro LEDs in the plurality of transfer snips 10, obviating waste of materials.

In one particular example, the plurality of transfer strips 10 include a first transfer strip, a second transfer strip, and a third transfer strip. A plurality of micro LEDs of a first color (e.g., a plurality of red micro LEDs) we transferred onto the first transfer strip, a plurality of micro LEDs of a second color (e.g., a plurality of green micro LEDs) are transferred onto the second transfer strip, and a plurality of micro LEDs of a third color (e.g., a plurality of blue macro LEDs) are transferred onto the third transfer strip. Subsequently, the first transfer strip, the second transfer strip, and the third transfer strip are aligned together to form an array of micro LEDs in which a respective one of the plurality of micro LEDs of the first color, a respective one of the plurality of micro LEDs of the second color, and a respective one of the plurality of micro LEDs of the third color we aligned along the second direction.

Figure 14:
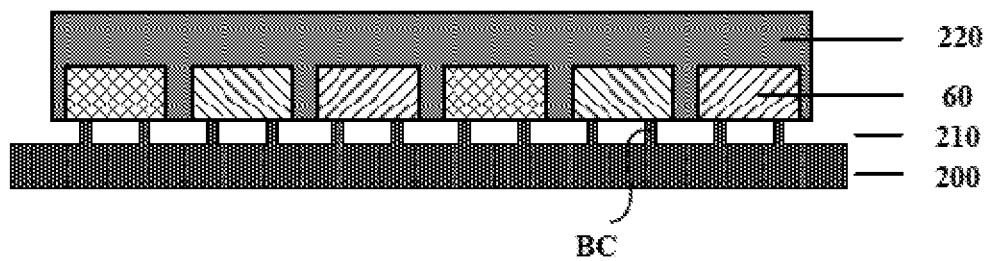
FIG. 14 is a schematic diagram illustrating the structure of an array substrate having a plurality of micro LEDs transferred by a method in some embodiments according to the present disclosure.

In another aspect, the present disclosure provides an array substrate having a plurality of micro LEDs transferred by a method described herein. FIG. 14 is a schematic diagram illustrating the structure of an array substrate having a plurality of micro LEDs transferred by a method in some embodiments according to the present disclosure. Referring to FIG. 14, the array substrate in some embodiments includes a base substrate 200, a bonding layer 210 having a plurality of bonding contacts BC on the base substrate 200, and a plurality of micro LEDs 60 on a side of the bonding layer 210 away from the base substrate 200. Optionally, the array substrate further includes a substantially transparent protective layer 220 on a side of the plurality of micro LEDs 60 away from the base substrate 200.

In another aspect, the present disclosure provides a display apparatus having an array substrate described herein or fabricated by a method described herein. Examples of appropriate display apparatuses include, but are not limited to, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise for to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claim appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiment of the invention does not imply a limitation on the invention, and no such limitation is to be infeed. The invention is limited only by the spirt and scope of the appended claim. Moreover, these claims may refer to use "first" "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is ended to be dedicated to the public regardless of whether the element or component is explicitly recited in the following claim.

What is claimed is:

1. A method of transferring a plurality of micro light emitting diodes (micro LEDs) to a target substrate, comprising:
    providing a plurality of transfer strips, a respective one of the plurality of transfer strips comprising a plurality of holding cells sequentially arranged along a first direction, a respective one of the plurality of holding cells configured to receive a respective one of the plurality of micro LEDs, the respective one of the plurality of holding cells being severable from the respective one of the plurality of transfer strips;
    transferring the plurality of micro LEDs onto the plurality of holding cells of the plurality of transfer strips;
    aligning the plurality of transfer strips having the plurality of micro LEDs transferred thereon with respect to each other, to form an array of micro LEDs in which micro LEDs from different transfer strips of the plurality of transfer strips are aligned along a second direction and micro LEDs from a same transfer strip of the plurality of transfer strips are aligned along the first direction, the second direction being different from the first direction; and
    subsequent to aligning the plurality of transfer strips having the plurality of micro LEDs transferred thereon, adhering neighboring transfer strips of the plurality of transfer strips having the plurality of micro LEDs transferred thereon together.

2. The method of claim 1, wherein aligning the plurality of transfer strips is based on a plurality of alignment marks on the plurality of transfer strips; and
    wherein alignment marks from different transfer strips of the plurality of transfer strips are aligned along the second direction.

3. An array substrate, comprising the plurality of micro LEDs transferred by the method of claim 1.

4. A display apparatus, comprising the array substrate of claim 3.

5. A method of transferring a plurality of micro light emitting diodes (micro LEDs) to a target substrate, comprising:
    providing a plurality of transfer strips, a respective one of the plurality of transfer strips comprising a plurality of holding cells sequentially arranged along a first direction, a respective one of the plurality of holding cells configured to receive a respective one of the plurality of micro LEDs, the respective one of the plurality of holding cells being severable from the respective one of the plurality of transfer strips;

transferring the plurality of micro LEDs onto the plurality of holding cells of the plurality of transfer strips;

aligning the plurality of transfer strips having the plurality of micro LEDs transferred thereon with respect to each other, to form an array of micro LEDs in which micro LEDs from different transfer strips of the plurality of transfer strips are aligned along a second direction and micro LEDs from a same transfer strip of the plurality of transfer strips are aligned along the first direction, the second direction being different from the first direction; and subsequent to aligning the plurality of transfer strips having the plurality of micro LEDs transferred thereon, severing the plurality of holding cells from the respective one of the plurality of transfer strips, to form a plurality of micro LED strips, a respective one of the plurality of micro LED strips comprising micro LEDs from different transfer strips of the plurality of transfer strips sequentially arranged along the second direction.

6. The method of claim 5, wherein severing the plurality of holding cells comprises cutting a base of the plurality of transfer strips along a first cutting groove and a second cutting groove along the second direction, to sever a row of holding cells along the second direction, thereby forming the respective one of the plurality of micro LED strips.

7. The method of claim 5, subsequent to severing the plurality of holding cells from the respective one of the plurality of transfer strips, further comprising adhering neighboring micro LED strips of the plurality of micro LED strips together, to form a micro LED substrate in which the micro LEDs from the different transfer strips of the plurality of transfer strips are aligned along the second direction and the micro LEDs from the same transfer strip of the plurality of transfer strips are aligned along the first direction.

8. The method of claim 7, further comprising transferring the plurality of micro LEDs in the micro LED substrate onto the target substrate.

9. A method of transferring a plurality of micro light emitting diodes (micro LEDs) to a target substrate, comprising:

providing a plurality of transfer strips, a respective one of the plurality of transfer strips comprising a plurality of holding cells sequentially arranged along a first direction, a respective one of the plurality of holding cells configured to receive a respective one of the plurality of micro LEDs, the respective one of the plurality of holding cells being severable from the respective one of the plurality of transfer strips;

transferring the plurality of micro LEDs onto the plurality of holding cells of the plurality of transfer strips;

aligning the plurality of transfer strips having the plurality of micro LEDs transferred thereon with respect to each other, to form an array of micro LEDs in which micro LEDs from different transfer strips of the plurality of transfer strips are aligned along a second direction and micro LEDs from a same transfer strip of the plurality of transfer strips are aligned along the first direction, the second direction being different from the first direction; and subsequent to transferring the plurality of micro LEDs onto the plurality of holding cells of the plurality of transfer strips and prior to aligning the plurality of transfer strips having the plurality of micro LEDs transferred thereon with respect to each other, testing the plurality of micro LEDs to detect a defective micro LED.

10. The method of claim 9, further comprising removing the defective micro LED from the respective one of the plurality of transfer strips; and reassembling the respective one of the plurality of transfer strips having the defective micro LED removed into a continuous transfer strip.

11. The method of claim 10, wherein removing the defective micro LED from the respective one of the plurality of transfer strips comprises:

cutting the respective one of the plurality of transfer strips along a respective one of a plurality of third cutting grooves and a respective one of a plurality of fourth cutting grooves.

* * * * *